United States Patent
Hwang et al.

(10) Patent No.: US 9,859,410 B2
(45) Date of Patent: Jan. 2, 2018

(54) HIGH ELECTRON MOBILITY TRANSISTORS AND METHODS OF FABRICATING THE SAME

(71) Applicant: Samsung Electronics Co., Ltd., Suwon-Si, Gyeonggi-Do (KR)

(72) Inventors: In-jun Hwang, Hwaseong-si (KR); Jai-kwang Shin, Anyang-si (KR); Jae-joon Oh, Seongnam-si (KR); Jong-seob Kim, Hwaseong-si (KR); Hyuk-soon Choi, Hwaseong-si (KR); Ki-ha Hong, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/497,585

(22) Filed: Sep. 26, 2014

(65) Prior Publication Data
US 2015/0008485 A1    Jan. 8, 2015

Related U.S. Application Data

(63) Continuation of application No. 13/151,475, filed on Jun. 2, 2011, now Pat. No. 8,878,246.

(30) Foreign Application Priority Data

Jun. 14, 2010    (KR) .......................... 10-2010-0056192

(51) Int. Cl.
*H01L 29/778* (2006.01)
*H01L 29/267* (2006.01)
(Continued)

(52) U.S. Cl.
CPC ........ *H01L 29/778* (2013.01); *H01L 29/0847* (2013.01); *H01L 29/1029* (2013.01);
(Continued)

(58) Field of Classification Search
CPC ........... H01L 29/66462; H01L 29/7783; H01L 29/7786
See application file for complete search history.

(56) References Cited

U.S. PATENT DOCUMENTS 7,170,111 B2    1/2007 Saxler
7,332,795 B2    2/2008 Smith et al.
(Continued)

FOREIGN PATENT DOCUMENTS

JP    06204258 A    7/1994
JP    09172163 A    6/1997
(Continued)

OTHER PUBLICATIONS

Ibbetson, et al., "Polarization Effects, Surface States, and the Source of Electrons in AlGaN/GaN Heterostructure Field Effect Transistors", Applied Physics Letters, vol. 77, No. 2 (pp. 250-252), Jul. 10, 2000.
(Continued)

*Primary Examiner* — Peniel M Gumedzoe
*Assistant Examiner* — Christopher Johnson
(74) *Attorney, Agent, or Firm* — Harness, Dickey, & Pierce, P.L.C.

(57) ABSTRACT

A High electron mobility transistor (HEMT) includes a source electrode, a gate electrode, a drain electrode, a channel forming layer in which a two-dimensional electron gas (2DEG) channel is induced, and a channel supplying layer for inducing the 2DEG channel in the channel forming layer. The source electrode and the drain electrode are located on the channel supplying layer. A channel increase layer is between the channel supplying layer and the source and drain electrodes. A thickness of the channel supplying layer is less than about 15 nm.

11 Claims, 4 Drawing Sheets

(51) Int. Cl.
  *H01L 29/51* (2006.01)
  *H01L 29/66* (2006.01)
  *H01L 29/08* (2006.01)
  *H01L 29/10* (2006.01)
  *H01L 29/20* (2006.01)
  *H01L 29/423* (2006.01)

(52) U.S. Cl.
  CPC .......... *H01L 29/267* (2013.01); *H01L 29/517* (2013.01); *H01L 29/66431* (2013.01); *H01L 29/66462* (2013.01); *H01L 29/7785* (2013.01); *H01L 29/7786* (2013.01); *H01L 29/1066* (2013.01); *H01L 29/2003* (2013.01); *H01L 29/4236* (2013.01); *H01L 29/42364* (2013.01)

(56) References Cited

U.S. PATENT DOCUMENTS

| | | | |
|---|---|---|---|
| 7,612,390 | B2 | 11/2009 | Saxler et al. |
| 2006/0006414 | A1* | 1/2006 | Germain ............... H01L 29/452 257/192 |
| 2007/0228416 | A1 | 10/2007 | Chen et al. |
| 2007/0254418 | A1 | 11/2007 | Sheppard et al. |
| 2007/0278518 | A1 | 12/2007 | Chen et al. |
| 2007/0295993 | A1 | 12/2007 | Chen et al. |
| 2008/0006845 | A1 | 1/2008 | Derluyn et al. |
| 2009/0045438 | A1* | 2/2009 | Inoue ................... H01L 29/155 257/192 |
| 2009/0146185 | A1* | 6/2009 | Suh ..................... H01L 29/2003 257/194 |
| 2009/0267078 | A1 | 10/2009 | Mishra et al. |
| 2009/0283756 | A1 | 11/2009 | Hellings et al. |
| 2010/0012977 | A1 | 1/2010 | Derluyn et al. |
| 2010/0102359 | A1 | 4/2010 | Khan et al. |
| 2010/0219452 | A1* | 9/2010 | Brierley ............... H01L 29/205 257/194 |
| 2011/0057257 | A1* | 3/2011 | Park ................... H01L 29/42376 257/330 |
| 2011/0303952 | A1 | 12/2011 | Hwang et al. |
| 2012/0098599 | A1* | 4/2012 | Chang ................. H01L 29/7787 330/277 |

FOREIGN PATENT DOCUMENTS

| | | |
|---|---|---|
| JP | 09246527 A | 9/1997 |
| JP | 10335638 A | 12/1998 |
| JP | 11177080 A | 7/1999 |
| JP | 2009-054807 A | 3/2009 |
| JP | 2010-045343 A | 2/2010 |
| KR | 10-1999-0075338 A | 10/1999 |
| KR | 10-0291201 B1 | 11/2000 |
| KR | 1020040018502 A | 3/2004 |
| KR | 10-2009-0091868 A | 8/2009 |

OTHER PUBLICATIONS

Onojima, et al.; "Reduction in Potential Barrier Height of AlGaN/GaN heterostructures by SiN Passivation", Journal of Applied Physics 101, (2007).

U.S. Office Action dated Dec. 20, 2012 corresponding to U.S. Appl. No. 13/064,287.

U.S. Office Action dated Oct. 4, 2013 corresponding to U.S. Appl. No. 13/064,287.

Uemoto et al., "Gate injection Transistor (GIT)—A Normally-Off Al GaN/GaN Power Transistor Using conductivity Modulation", IEEE Transactions on Electron Devices, vol. 54 No. 12, Dec. 2007, pp. 3393-3399.

Saito et al., "Recessed-Gate Structure Approach Toward Normally Off High-Voltage Al GaN/GaN HEMT for Power Electronics Applications", IEEE Transactions on Electron Devices, vol. 53, No. 2, Feb. 2006, pp. 356-362.

Shealy, et al., "Growth and Passivation of AlGaN/GaN Heterostructures", Journal of Crystal Growth 250 (pp. 7-13), (2003).

Song et al., "Normally Off AlGaN/GaN Low-Density Drain HEMT (LDD-HEMT) With Enhanced Breakdown Voltage and Reduced Current Collapse," Electron Device Letters, IEEE , vol. 28, No. 3, pp. 189-191, Mar. 2007.

Ostermaier, et al., "Ultrathin InAlN/AlN Barrier HEMT With High Performance in Normally Off Operation," Electron Device Letters, IEEE , vol. 30, No. 10, pp. 1030-1032, Oct. 2009.

Final Office Action for corresponding U.S. Appl. No. 13/064,287 dated Oct. 3, 2014.

Song, et al. "Normally off AlGaN/GaN Low-Density Drain HEMT (LDD-HEMT) with Enhanced Breakdown Voltage and Reduced Current Collapse," IEEE Electron Device Letters, vol. 28, No. 3, pp. 189-191 (2007).

Korean Office Action dated Jun. 19, 2017 issued in corresponding Korean Application No. 10-2011-0056439 (English translation provided).

* cited by examiner

HIGH ELECTRON MOBILITY TRANSISTORS AND METHODS OF FABRICATING THE SAME

CROSS-REFERENCE TO RELATED APPLICATION

This application is a continuation application of U.S. application Ser. No. 13/151,475, filed on Jun. 2, 2011, which claims priority under 35 U.S.C. §119 to Korean Patent Application No. 10-2010-0056192, filed on Jun. 14, 2010, in the Korean Intellectual Property Office (KIPO), the entire contents of each of which is incorporated herein by reference.

BACKGROUND

1. Field

Example embodiments relate to semiconductor devices and methods of fabricating the same, and more particularly, to high electron mobility transistors (HEMTs) and methods of fabricating the same.

2. Description of the Related Art

High electron mobility transistors (HEMTs) include semiconductors with different band gaps and/or polarizabilities bonded together. In the HEMT, a semiconductor having a larger band gap functions as a donor. A two-dimensional electron gas (2DEG) is formed in a semiconductor having a smaller band gap by the semiconductor having a larger band gap.

A 2DEG may be used as a channel of a HEMT. A HEMT may be a kind of power transistor with a high breakdown-voltage and improved electron carrier mobility. The HEMT may include a semiconductor having a wide band gap, for example, a compound semiconductor. Therefore, the HEMT may have a high breakdown voltage.

The 2DEG may be induced by performing an n-doping process on a material having a large band gap or by using a material having polarization. The HEMT may include a channel without applied bias, and thus, may be normally on and operate in a depletion mode. During a turning-off operation of a HEMT, the 2DEG between a gate and a drain may be removed (e.g., by an applied voltage) and space charges remain. An electric field may concentrate on the gate due to the space charges. The breakdown voltage of the HEMT may be reduced due to the concentration of the electric field on the gate. In order to reduce a space charge electric field at the gate, a region performing the same function as that of a lightly doped drain (LDD) (hereinafter, referred to as an low density 2DEG region) may be induced in the 2DEG channel of the HEMT.

A low density 2DEG region may also lead to the formation of an enhancement mode HEMT. In considering simplification of circuits, a HEMT operating in an enhancement mode (hereinafter, referred to as E-mode) may be desired. The E-mode may be realized by removing at least a portion of a channel (e.g., electron density in the channel) located under a gate.

During the fabrication processes of the HEMT, the 2DEG channel with a relatively higher concentration of electrons may be induced first, and then, the concentration of electrons on a portion of the 2DEG channel, which corresponds to the low density 2DEG region, may be reduced. The 2DEG may be removed at a portion where the gate will be formed in order to form the E-mode HEMT. The electron concentration in the 2DEG channel may be reduced by etching an upper layer formed on the 2DEG channel and/or oxidizing the upper layer in order to form the low density 2DEG region. However, it may be difficult to control these methods for reducing the electron concentration when compared to an implant process that is used to form a silicon metal-on-semiconductor (MOS) transistor. Therefore, it may be difficult to form the low density 2DEG region having an appropriate electron concentration, and a reproducibility of the low density 2DEG region may be degraded. Thus, operations of a HEMT may not be reliable.

SUMMARY

Example embodiments may provide methods of fabricating high electron mobility transistors (HEMTs), which may control fabrication processes and realize a certain operation mode easily. Example embodiments may provide HEMTs fabricated using the methods.

According to example embodiments, a high electron mobility transistor (HEMT) includes a source electrode, a gate electrode, a drain electrode, a channel forming layer, in which a two-dimensional electron gas (2DEG) channel is formed, and a channel supplying layer for forming the 2DEG channel in the channel forming layer. The source electrode and the drain electrode are located on the channel supplying layer, and a channel increase layer is disposed between the source electrode and the drain electrode, and the channel supplying layer.

A thickness of the channel supplying layer may be greater than 0 and equal to or less than 15 nm. The channel forming layer may include a lightly doped drain (LDD) region between the gate electrode and the drain electrode. The channel supplying layer may include a recess, and the gate electrode may be formed in the recess. The channel supplying layer may include an oxidation region under the gate electrode. The HEMT may further include a p-type semiconductor or a dielectric material between the channel supplying layer and the gate electrode. The HEMT may further include an insulating layer between the gate electrode and the channel supplying layer. The channel increase layer may include a group-IV semiconductor, a compound of the group-IV semiconductor, an n-type semiconductor, or a dielectric material.

According to other example embodiments, a method of fabricating a high electron mobility transistor (HEMT), which includes at least a two-dimensional electron gas (2DEG) channel, a source electrode, a drain electrode, and a gate electrode, includes forming a first 2DEG channel including a lightly doped drain (LDD) region and increasing an electron density of the first 2DEG channel except for portions corresponding to the low density 2DEG region and the gate electrode.

The method may further include depleting the first 2DEG channel corresponding to the gate electrode. The forming of the first 2DEG channel may include forming a channel forming layer, in which the first 2DEG channel is formed, and forming a channel supplying layer for forming the first 2DEG channel in the channel forming layer. The channel supplying layer may be formed to a thickness, by which an electron density of the first 2DEG channel becomes an electron density of the low density 2DEG region. A thickness of the channel supplying layer may be greater than 0 and equal to or less than 15 nm. The increasing of the electron density may include forming channel increase layers on separate portions of the channel supplying layer, and the source electrode and the drain electrode may be formed on the separate portions.

The channel increase layer may include a group-IV semiconductor, a compound of the group-IV semiconductor, an n-type semiconductor, or a dielectric material. The depleting of the first 2DEG channel corresponding to the gate electrode may include forming a recess in a portion of the channel supplying layer, which corresponds to the gate electrode. The depleting of the first 2DEG channel corresponding to the gate electrode may include forming an oxidation region in the channel supplying layer corresponding to the gate electrode. The depleting of the first 2DEG channel corresponding to the gate electrode may include forming a p-type semiconductor or a dielectric material between the gate electrode and a lower layer in which the gate electrode is formed. The method may further include an insulating layer between the gate electrode and the channel supplying layer.

According to one or more example embodiments, a high electron mobility transistor (HEMT) includes a channel forming layer, a channel supplying layer on the channel forming layer, the channel supplying layer configured to induce a two-dimensional electron gas (2DEG) channel in the channel forming layer, a channel increase layer on the channel supplying layer, source and drain electrodes on the channel increase layer, and a gate electrode on the channel supplying layer.

According to one or more example embodiments, a method of fabricating a high electron mobility transistor (HEMT) includes inducing a first two-dimensional electron gas (2DEG) channel and increasing an electron density of the first 2DEG channel outside of an low density 2DEG region and a region corresponding to a gate electrode.

BRIEF DESCRIPTION OF THE DRAWINGS

Example embodiments will be more clearly understood from the following brief description taken in conjunction with the accompanying drawings.

FIGS. 1-4 are cross-sectional diagrams illustrating methods of fabricating high electron mobility transistors (HEMTs) according to an example embodiment;

FIGS. 5-7 are cross-sectional diagrams illustrating methods of fabricating HEMTs according to an example embodiment; and FIG. 8 is a cross-sectional diagram illustrating methods of fabricating HEMTs according to an example embodiment.

Figure 1:
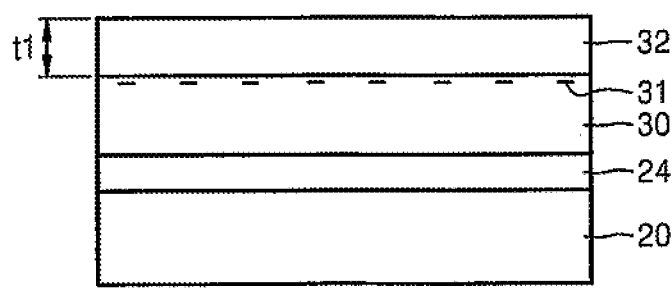
FIGS. 1-8 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1-4 are cross-sectional diagrams illustrating methods of fabricating high electron mobility transistors (HEMTs) according to an example embodiment. Referring to FIG. 1, a buffer layer 24 may be formed on a substrate 20. The substrate 20 may be, for example, a sapphire substrate, a semiconductor substrate (e.g., a silicon substrate) and/or an epitaxial layer. The buffer layer 24 may be, for example, an AlN layer and/or an AlGaN layer.

A first material layer 30 and a second material layer 32 may be on the buffer layer 24 (e.g., sequentially stacked on the buffer layer 24). The first and second material layers 30 and 32 may be semiconductor layers with different polarizabilities and/or different band gaps. The polarizability and band gap of the first material layer 30 may be less than the polarizability and band gap of the second material layer 32. The first material layer 30 may be a semiconductor layer, for example, a GaN layer and/or an InGaN layer. The second material layer 32 may be a semiconductor layer, for example, an AlGaN layer, an AlInN layer, an AlGaInN layer, and/or an AlN layer. According to the difference between the polarizabilities of the first and second material layers 30 and 32, a polarization (not shown) may occur in the second material layer 32. Negative charges 31 generated at an interface of the first material layer 30, which contacts the second material layer 32, may denote a first two-dimensional electron gas (2DEG). The first 2DEG may occur in order to compensate for surface charges caused by the polarization of the second material layer 32. The first 2DEG may be used, for example, as an n-channel.

Because the first 2DEG channel may be formed in the first material layer 30 due to the second material layer 32, the second material layer 32 may be a channel supplying layer that forms the 2DEG channel in the first material layer 30, the first material layer 30 being of less polarizability (and/or less band gap). The first 2DEG channel formed by the second material layer 32 (a channel supplying layer) may be formed in the first material layer 30, and the first material layer 30 may include the first 2DEG channel. The first material layer 30 may be a layer in which the first 2DEG channel is formed (a channel forming layer).

A thickness t1 of the second material layer 32 (the channel supplying layer) may be, for example, less than or equal to about 15 nm. For example, the second material layer 32 may satisfy $0<t1\leq$ about 15 nm. The thickness t1 of the second material layer 32 may be determined based on aluminum content of the second material layer 32. For example, second material layer 32 may be thinned as a content of aluminum (Al) increases, and may be thickened as the content of Al is reduced. According to the thickness t1 of the second material layer 32, the electron density of the first 2DEG channel formed in the first material layer 30 may range from about $10^{10}/cm^2$ to about $5\times10^{12}/cm^2$, for example. The electron density may correspond to an electron density of a low density 2DEG region, and thus, the low density 2DEG region may be induced in the first material layer 30.

Figure 2:
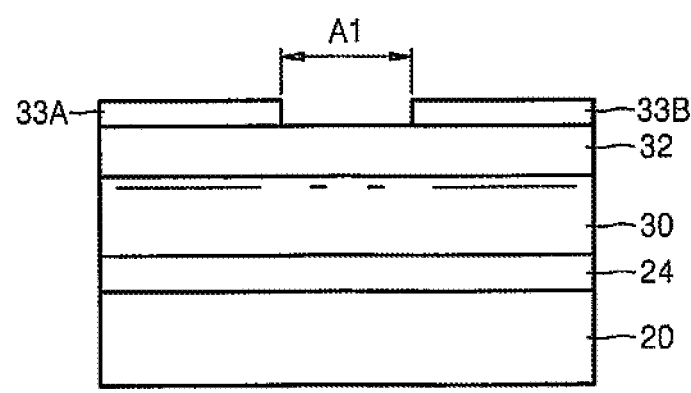

Referring to FIG. 2, channel increase layers 33A and 33B may be formed on the second material layer 32. The channel increase layers 33A and 33B may be separated from each other. The second material layer 32 exposed between the channel increase layers 33A and 33B may correspond to a region A1 of the first material layer 30. The region A1 of the first material layer 30 may include a portion that is used as a low density 2DEG region and a portion corresponding to a gate electrode. When the channel increase layers 33A and 33B are formed, the electron density of the first 2DEG channel under the channel increase layers 33A and 33B may be increased. The electron density of the first 2DEG channel under the channel increase layers 33A and 33B may become higher than that of the region A1 of the first material layer 30.

In FIGS. 2-8, the difference between the electron densities is represented by a difference between the densities of signs (−) representing negative charges. The channel increase layer 33 may be, for example, a group-IV semiconductor layer, a compound layer of a group-IV semiconductor, an n-type semiconductor layer, and/or a dielectric layer. The group-IV semiconductor may be, for example, C, Si, and/or Ge. The compound of a group-IV semiconductor may be, for example, a nitride material (e.g., CN, SiN, and/or GeN).

A method of forming a HEMT according to example embodiments may include inducing a low density 2DEG region first. The electron density of the 2DEG channel outside of the region A1 of the first material layer 30 may be adjusted (e.g., increased) by the formation of channel increase layers 33A and 33B. The electron density of the 2DEG channel in the low density 2DEG region may be determined by a thickness of the thin film when the channel supplying layer is formed. Because the electron density of the low density 2DEG region is determined during the forming of the channel supplying layer according to the thickness of the second material layer 32, the electron density of the low density 2DEG region may be easily adjusted to an appropriate level, and reproducibility of the low density 2DEG region may be improved. The reliability of operations of the HEMT may also be improved. In addition, because the low density 2DEG region is formed first, the electron density of the 2DEG channel corresponding to the gate electrode may be reduced to the level of the electron density in the low density 2DEG region. Depletion of the 2DEG channel corresponding to the gate electrode may be performed easily as compared to the conventional art. An E-mode HEMT may be formed easily.

Figure 3:
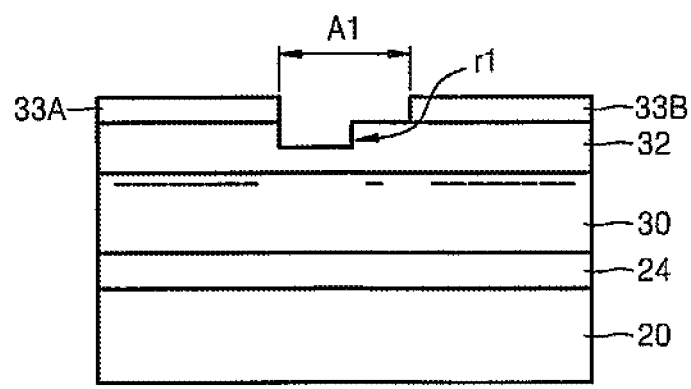

Referring to FIG. 3, a recess r1 may be formed in the second material layer 32 between the channel increase layers 33A and 33B. The recess r1 may only be formed in a part of the second material layer 32 between the channel increase layers 33A and 33B. Because the recess r1 is formed by removing a part of the second material layer 32, a portion in the region A1 of the first material layer 30 corresponding to the recess r1 may be depleted due to the formation of the recess r1. The electron density of the first 2DEG channel in the region A1 of the first material layer 30 may be as low as the electron density level of the low density 2DEG region and depletion due to a recess region may be easily achieved. Therefore, an E-mode HEMT may be fabricated in a simple way. In the region A1 of the first material layer 30, a region that does not correspond to the recess r1, a region between the recess r1 and the channel increase layer 33B (e.g., illustrated in FIG. 3 as the right side of the region A1), may substantially become the low density 2DEG region.

Figure 4:
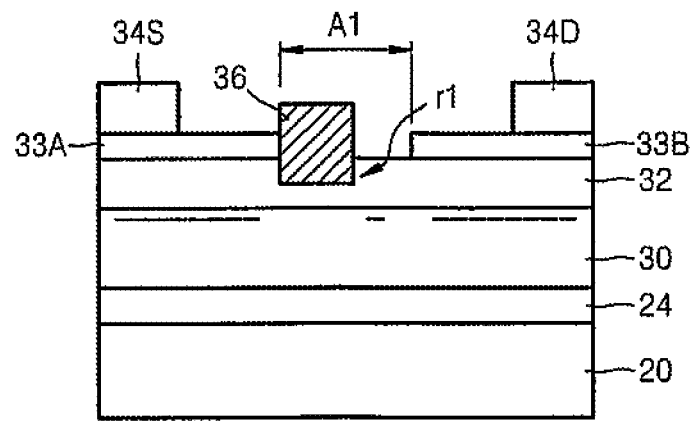

Referring to FIG. 4, a source electrode 34S and a drain electrode 34D may be formed on the channel increase layers 33A and 33B. The source electrode 34S and the drain electrode 34D may be separated from each other. The source electrode 34S may be formed on the channel increase layer 33A that is adjacent to the recess r1. The drain electrode 34D may be formed on the channel increase layer 33B that is separated from the recess r1. A gate electrode 36 may be formed in the recess r1. For example, the gate electrode 36 may be formed in the recess r1 after the forming of the source and drain electrodes 34S and 34D. The gate electrode 36 may be formed to fill the recess r1. The gate electrode 36 may be formed with at least one surface that is a greater distance from the substrate 20 than the channel increase layers 33A and 33B. A part of the gate electrode 36 may overlap the channel increase layer 33A that is adjacent to the recess r1 in a direction orthogonal to the substrate.

Figure 5:
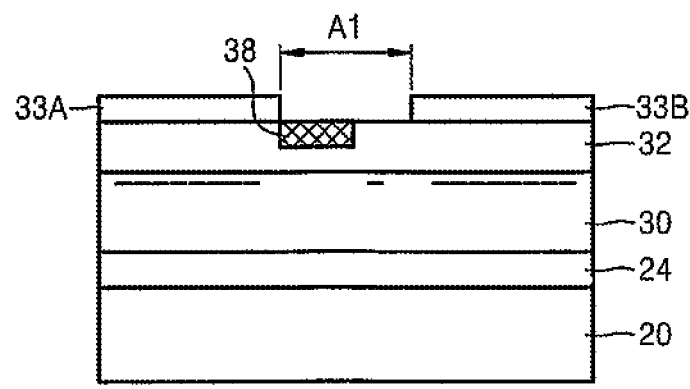
Figure 6:
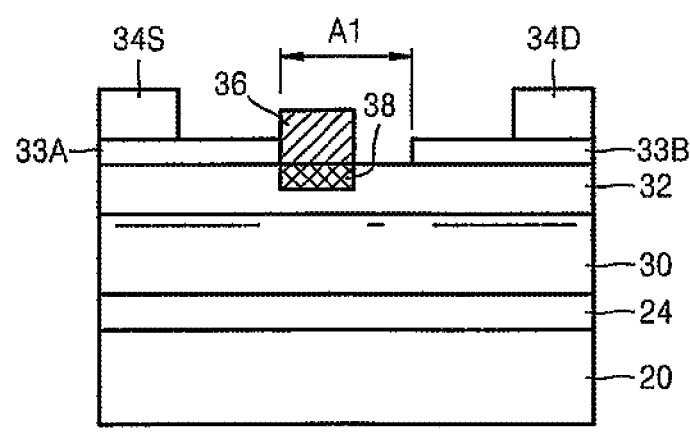
Figure 7:
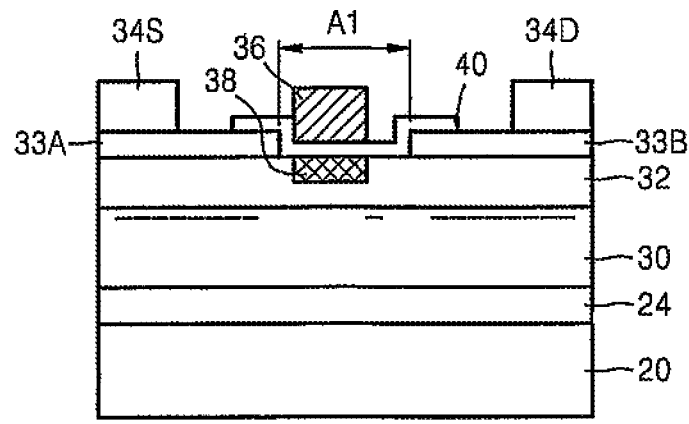

FIGS. 5-7 are cross-sectional diagrams illustrating methods of fabricating HEMTs according to an example embodiment. Referring to FIG. 5, a buffer layer 24, a first material layer 30, a second material layer 32, and channel increase layers 33A and 33B may be formed by, for example, performing processes as described with respect to FIGS. 1 and 2. An oxygenated region 38 may be formed on (e.g., extending into) the second material layer 32 between the channel increase layers 33A and 33B. The oxygenated region 38 may be formed by oxidizing a material in various ways. According to a depth of the oxygenated region 38 and/or a density of oxygen included in the oxygenated region 38, the 2DEG channel under the oxygenated region 38 may be completely removed or the electron density of the 2DEG channel under the oxygenated region 38 may be reduced. A HEMT fabricated with a depleted 2DEG channel under the oxygenated region 38, due to the oxygenated region 38, may be realized as an E-mode HEMT. Depletion may be easily performed when compared with the conventional art in which a low density 2DEG region is formed after formation of the 2DEG channel.

The oxygenated region 38 may be a deposited material including oxygen. According to example embodiments, the oxygenated region 38 may be a region obtained by oxidizing a portion of the second material layer 32. The oxygenated region 38 may include an oxide of the second material layer 32, for example, aluminum oxide. The oxygenated region 38 may include oxygen ions that perform as acceptors of the electrons in the 2DEG channel. The oxygen density of the oxygenated region 38 may be a density of the oxygen ions. Content of an element inducing polarization (e.g., aluminum) in the oxygenated region 38 may be less than that of any other region of the second material layer 32. The polarizability of the oxygenated region 38 may be less than that of the other regions of the second material layer 32.

A difference between polarizabilities of the oxygenated region 38 and the first material layer 30 may be less than a difference between the polarizabilities of the second material layer 32 around the oxygenated region 38 and the first material layer 30. The electron density of the 2DEG channel of the first material layer 30 under the oxygenated region 38 may be reduced. If the oxygenated region 38 includes oxygen ions performing as acceptors, the electrons in the 2DEG channel may be directly accepted by the oxygen ions. The electron density of the 2DEG channel in the first material layer 30 under the oxygenated region 38 may be reduced because the oxygen ions perform as acceptors.

Referring to FIG. 6, source and drain electrodes 34S and 34D may be formed on the channel increase layers 33A and 33B (e.g., as described with reference to FIG. 4). The gate electrode 36 may be formed on the oxygenated region 38. According to example embodiments, the oxygenated region 38 may be formed after forming the source and drain electrodes 34S and 34D. For example, a mask (not shown) covering the source electrode 34S, the drain electrode 34D, and the channel increase layers 33A and 33B, and exposing a portion of the second material layer 32 corresponding to the oxygenated region 38, may be formed on the second material layer 32.

The exposed portion of the second material layer 32 may be processed with oxygen. For example, the exposed portion may be oxidized by an oxygen process to form the oxygenated region 38. The oxygen process may be, for example, an $O_2$ plasma process, an $O_2$ anneal, an $O_3$ process, ultraviolet (UV) ray oxidation, an O radical process and/or an O implant. A gate material layer (not shown) may be formed on an upper surface of the oxygenated region 38 and on the mask. The mask may be removed in a lift-off method. The gate material layer formed on the mask may be removed with the mask and the gate electrode 36 may be formed on the oxygenated layer 38.

Referring to FIG. 7, according to an example embodiment, an insulating layer 40 may be formed between the gate electrode 36 and the oxygenated region 38. The insulating layer 40 may be, for example, an aluminum oxide layer, a silicon oxide layer and/or a silicon nitride layer. When an insulating layer 40 is formed, the oxygenated layer 38 and the gate electrode 36 may be formed as described above with respect to FIGS. 5 and 6. For example, the oxygenated layer 38 and the gate electrode 36 may be formed after forming the insulating layer 40.

Figure 8:
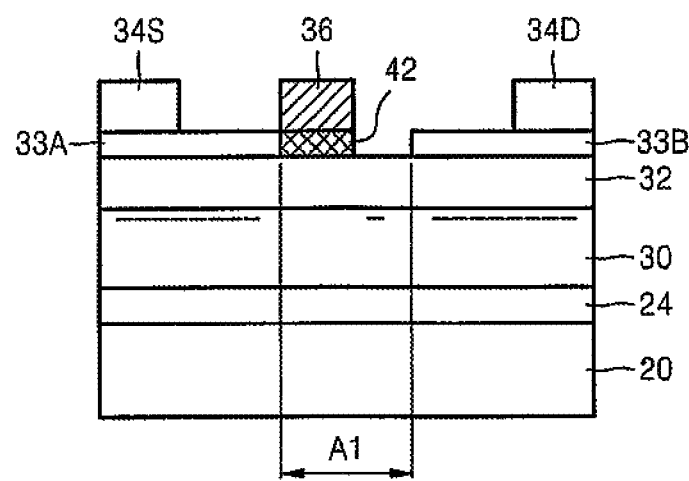

FIG. 8 is a cross-sectional diagram illustrating methods of fabricating HEMTs according to an example embodiment. Referring to FIG. 8, a buffer layer 24, a first material layer 30, a second material layer 32 and channel increase layers 33A and 33B may be formed by, for example, performing processes as described with reference FIGS. 1 and 2. Source and drain electrodes 34S and 34D may be formed on the channel increase layers 33A and 33B that are separated from each other (e.g., as described with reference to FIG. 4). A p-type semiconductor and/or a dielectric material 42 may be formed on a part of the second material layer 32 between the separated channel increase layers 33A and 33B. A gate electrode 36 may be formed on the p-type semiconductor and/or the dielectric material 42.

The p-type semiconductor may be a 3-N semiconductor, for example, p-GaN, p-AlGaN, p-AlInN, and/or p-AlGaInN. The p-type semiconductor and/or the dielectric material 42 may extend to an upper portion of the channel increase layers 33A and 33B. The gate electrode 36 may be formed to be separated from the channel increase layer 33B on which the drain electrode 34D is formed. In the region A1 of the first material layer 30, a portion corresponding to the p-type semiconductor and/or the dielectric material 42 may be depleted. The electron density of the region A1 may be as low as that of the low density 2DEG region and the depletion may be performed easily.

Structures of a HEMT (device) may be the same as those illustrated in FIGS. 4, 6, 7, and 8, and separate descriptions thereof are omitted.

While example embodiments have been particularly shown and described, it will be understood by one of ordinary skill in the art that variations in form and detail may be made therein without departing from the spirit and scope of the claims.

What is claimed is:

1. A high electron mobility transistor (HEMT), comprising:
    a channel forming layer;
    a channel supplying layer on the channel forming layer, the channel supplying layer configured to induce a two-dimensional electron gas (2DEG) channel in the channel forming layer;
    a channel increase layer on the channel supplying layer;
    a source electrode and a drain electrode on the channel increase layer; and
    a gate electrode on the channel supplying layer, wherein
    the channel forming layer includes a low density 2DEG region between the gate electrode and the drain electrode,
    the channel increase layer extends between the source electrode and the channel supplying layer and between the drain electrode and the channel supplying layer, and
    the channel supplying layer includes a recess, and the recess is completely filled with the gate electrode, wherein
    a portion of the channel increase layer disposed between the source electrode and the gate electrode is in direct contact with the gate electrode and a portion of the channel increase layer disposed between the drain electrode and the gate electrode is separated from the gate electrode.

2. The HEMT of claim 1, wherein a thickness of the channel supplying layer is less than or equal to about 15 nm.

3. A high electron mobility transistor (HEMT), comprising:
    a channel forming layer;
    a channel supplying layer on the channel forming layer, the channel supplying layer configured to induce a two-dimensional electron gas (2DEG) channel in the channel forming layer;
    a channel increase layer on the channel supplying layer;
    a source electrode and a drain electrode on the channel increase layer;
    a gate electrode on the channel supplying layer; and
    a p-type semiconductor and a dielectric material between the channel supplying layer and the gate electrode,
    wherein the channel forming layer includes a low density 2DEG region between the gate electrode and the drain electrode, and the channel increase layer extends between the source electrode and the channel supplying layer and between the drain electrode and the channel supplying layer, and
    wherein a portion of the channel increase layer disposed between the source electrode and the gate electrode is in direct contact with the p-type semiconductor, and a portion of the channel increase layer disposed between the drain electrode and the gate electrode is separated from the gate electrode.

4. The HEMT of claim 1, wherein the channel increase layer includes at least one of a group-IV semiconductor, a compound of a group-IV semiconductor, an n-type semiconductor and a dielectric material.

5. The HEMT of claim 1, wherein
    the channel supplying layer includes a first thickness under the gate electrode and a second thickness on the low density 2DEG region, and
    the first thickness of the channel supplying layer is less than the second thickness of the channel supplying layer.

6. A method of fabricating a high electron mobility transistor (HEMT), the method comprising:
    inducing a first two-dimensional electron gas (2DEG) channel by forming a channel supplying layer on a channel forming layer, the channel supplying layer inducing the first 2DEG channel in the channel forming layer;
    increasing an electron density of the first 2DEG channel outside of a low density 2DEG region and a region corresponding to a gate electrode, the increasing the electron density of the first 2DEG channel including forming the low density 2DEG region in the channel forming layer and forming a channel increase layer on the channel supplying layer; and
    forming a source electrode and a drain electrode on the channel increase layer,
    wherein the channel increase layer extends between the source electrode and the channel supplying layer and between the drain electrode and the channel supplying layer,
    wherein the increasing the electron density of the first 2DEG channel outside of the low density 2DEG region and the region corresponding to the gate electrode includes depleting the first 2DEG channel in the region corresponding to the gate electrode,
    wherein the depleting of the first 2DEG channel in the region corresponding to the gate electrode includes forming a recess in the channel supplying layer, the recess being completely filled with the gate electrode, and
    wherein a portion of the channel increase layer disposed between the source electrode and the gate electrode is in direct contact with the gate electrode and a portion of the channel increase layer disposed between the drain electrode and the gate electrode is separated from the gate electrode.

7. The method of claim 6
    wherein the channel supplying layer is formed to a thickness that induces the first 2DEG channel with an electron density corresponding to an electron density of the low density 2DEG region.

8. The method of claim 7, wherein a thickness of the channel supplying layer is less than or equal to about 15 nm.

9. The method of claim 6, wherein the forming the channel increase layer comprises forming a plurality of channel increase layers, each of the channel increase layers on a separate portion of the channel supplying layer, and
    the source electrode and the drain electrode are formed on the separate portions.

10. The method of claim 6, wherein the channel increase layer includes at least one of a group-IV semiconductor, a compound of a group-IV semiconductor, an n-type semiconductor and a dielectric material.

11. A method of fabricating a high electron mobility transistor (HEMT), the method comprising:
    inducing a first two-dimensional electron gas (2DEG) channel by forming a channel supplying layer on a channel forming layer, the channel supplying layer inducing the first 2DEG channel in the channel forming layer;

increasing an electron density of the first 2DEG channel outside of a low density 2DEG region and a region corresponding to a gate electrode, the increasing the electron density of the first 2DEG channel including forming the low density 2DEG region in the channel forming layer and forming a channel increase layer on the channel supplying layer; and forming a source electrode and a drain electrode on the channel increase layer, wherein the channel increase layer extends between the source electrode and the channel supplying layer and between the drain electrode and the channel supplying layer, wherein the increasing the electron density of the first 2DEG channel outside of the low density 2DEG region and the region corresponding to the gate electrode includes depleting the first 2DEG channel in the region corresponding to the gate electrode, wherein the depleting of the first 2DEG channel in the region corresponding to the gate electrode comprises forming a p-type semiconductor and a dielectric material between the gate electrode and the first 2DEG channel, wherein a portion of the channel increase layer disposed between the source electrode and the gate electrode is in direct contact with the p-type semiconductor, and a portion of the channel increase layer disposed between the drain electrode and the gate electrode is separated from the gate electrode.

* * * * *